United States Patent [19]

Senn

[11] Patent Number: 4,588,981
[45] Date of Patent: May 13, 1986

[54] DOUBLE INTEGRATION, DELTA-SIGMA, ANALOG-DIGITAL CODER

[76] Inventor: Patrice Senn, 13 Grande rue, 38000 Grenoble, France

[21] Appl. No.: 534,096

[22] Filed: Sep. 20, 1983

[30] Foreign Application Priority Data

Sep. 21, 1982 [FR] France ............... 82 15857

[51] Int. Cl.$^4$ ............................................. H04B 14/06
[52] U.S. Cl. .................. 340/347 AD; 375/33
[58] Field of Search .............. 340/347 AD, 347 NT; 375/27–33; 332/11 D

[56] References Cited

U.S. PATENT DOCUMENTS 4,301,446 11/1981 Petit ...................... 340/347 NT
4,439,756 3/1984 Shenoi .................. 340/347 NT

Primary Examiner—Charles D. Miller
Attorney, Agent, or Firm—Michael N. Meller

[57] ABSTRACT

The invention relates to a double integration or dual slope delta-sigma coder.

This coder comprises a first adder receiving on an input (36) a signal E(p) to be encoded and on an input (37) the coded signal S(p), a first integrator receiving on an input (32) an output signal of the first adder, a second adder receiving on an input (38) the output signal (31) of the first integrator, an input (39) of the second adder receiving a signal proportional to the coded signal, a second integrator connected to the second adder, a quantizer circuit (43), whereof one input (D) is connected to an output (41) of the second integrator, an output $\overline{Q}$ of said quantizer circuit supplying the coded signal S(p), wherein the integrators and adders are constituted by circuits comprising operational amplifiers (30, 40) and switched capacitor arrangements (35, 36, 45, 46).

6 Claims, 10 Drawing Figures

DOUBLE INTEGRATION, DELTA-SIGMA, ANALOG-DIGITAL CODER

BACKGROUND OF THE INVENTION

The present invention relates to a double integration or dual slope, delta-sigma, analog-digital coder. The invention applies to the coding of signals and more particularly to the transmission of signals on communications channels of the PCM type (pulse code modulation). It also applies to the measurement of d.c. voltages.

Circuits integrated on a substrate and particularly digital signal processing circuits are appearing in increasing numbers and with ever-greater complexity. The quality of the processing of the signal obtained as a result of these circuits, as well as the technical performances (size of the circuits, low dissipated power, reliability, etc.) make it possible to continuously envisage new uses of these circuits in fields which, hitherto have been reserved for analog circuits. However, there is at present a difficult to solve problem caused by the interface between the analog part and the digital part of a functional assembly. Although digital processing techniques have evolved very rapidly, this does not apply to analog-digital interfaces.

In most cases, the integration of a circuit of conventional analog-digital coder components is a very costly solution, it being very difficult to apply large-scale integration methods thereto.

This difficulty is overcome by using an analog-digital coder "with shaping of the noise spectrum", such as a delta-sigma coder. Such a coder is more particularly described in the article by Tewksbury and Hallock entitled "Oversampled, linear predictive and noise-shaping coders of order $N>1$", which appeared in the Journal "IEEE Transactions on Circuit and System", Vol. CAS-25, No. 7, July 1978. Such a coder is also described in U.S. Pat. No. 4,301,446. Delta-sigma noise spectrum shaping coders make it possible to reduce to the minimum the number of elements having to operate under linear conditions and which carry out most of the digital processing operations. The interest of these coders is that they make it possible to benefit to the maximum from the integration techniques of digital circuits. The analog part can be produced from discrete elements, or integrated on an additional analog circuit, or can even be directly integrated into the digital processing circuit if the technology permits. Another advantage of such coders is that when they use a quantization on a single bit for the digital conversion, they are relatively insensitive to transmission disturbances in a very noisy environment, e.g. an industrial environment. The noise spectrum shaping principle used in these coders ensures that they perform very well in the measurement of low-power d.c. voltages.

Double integration delta-sigma analog-digital coders are special coders, whose structure and operating principle are directly derived from the structure and operation of noise spectrum shaping coders.

The principle of a noise spectrum shaping coder has long been known and a very detailed study thereof is given in the above-cited article by Tewksbury et al.

Figure 1:
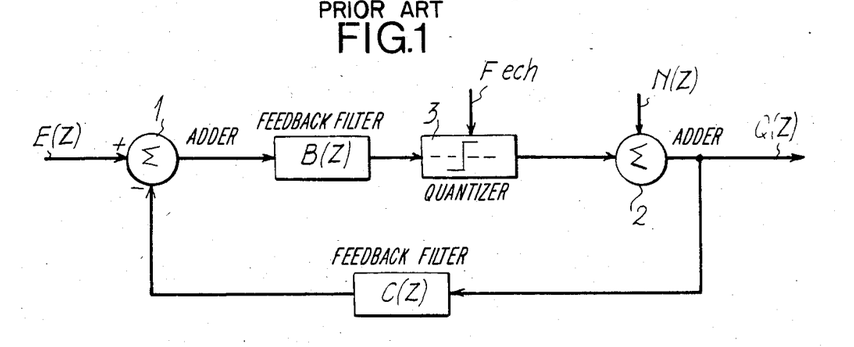

FIG. 1 diagrammatically shows a noise shaping coder, which comprises adders 1, 2 and a quantizer 3, which makes it possible to sample an input signal E(Z) at a frequency $F_{ech}$. It also comprises a feedback filter B(Z) and a negative feedback filter C(Z) in a feedback loop connecting the output of the coder to one of the inputs of adder 1. The output signal is designated Q(Z), whilst N(Z) represents the noise which is inherent in any analog-digital converter and appears during any quantization operation in such a conversion type. It is assumed that the input signal E(Z) has already been sampled at frequency $F_{ech}$ and hereinafter the state variable Z is used for representing the different signals.

It is known that the quantization noise N(Z) decreases as quantization becomes finer, i.e. when the number of bits at the output of the decoder is higher. Of interest in this coder is that it can operate with a very rough quantization. The remainder of the description only deals with two-level quantizers (one bit).

The output signal Q(Z) of the coder is easily expressed on the basis of F(Z) and N(Z) in the following way:

$$Q(Z)=B(Z)\cdot(E(Z)-Q(Z)\cdot C(Z))+N(Z)$$

$$Q(Z)=E(Z)\cdot B(Z)/(1+B(Z)\cdot C(Z))+N(Z)/(1+B(Z)\cdot C(Z))$$

B(Z) and C(Z) representing the transfer functions of the feedback and negative feedback filters.

It is said that a noise shaping coder is obtained when B(Z) and C(Z) satisfy the following equations:

$$B(Z)/(1+B(Z)\cdot C(Z))=Z^{-P} \text{ (pure phase shifter)}$$

$$1+B(Z)\cdot C(Z)=H(Z)$$

It has been shown, particularly in the aforementioned Tewksbury and Hallock article, that a function B(Z) of from $1/(1-Z^{-1})^n$ relative to an nth order digital integrator minimizes the noise in a signal frequency band B (extending from zero to B). When this function is involved, the noise spectrum shaping coder is then a delta-sigma coder, whose order is given by the power n of the function B(Z).

Figure 2:
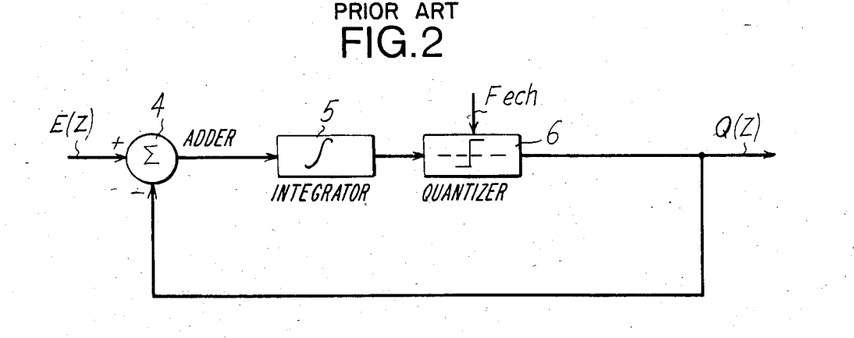
FIG. 2, already described, shows diagrammatically a known first-order delta-sigma coder.

FIG. 2 diagrammatically shows a first-order delta-sigma coder. This coder is also described in the aforementioned article and comprises an adder 4 receiving at its input an already sampled signal E(Z) and which receives at another input the output signal Q(Z). This coder also comprises an integrator 5 constituted in per se known manner by an operational amplifier circuit. The output of this integrator is connected to the input of a quantizer 6, which receives a sampling signal at a frequency $F_{ech}$ at a control input. In the case of this first order noise shaping coder, we obtain:

$$B(Z)=Z^{-1}/(1-Z^{-1})$$

in which B(Z) is the Z transfer function of an integrator associated with zero order 0 blocker. In this case, C(Z)=1, so that:

$$Q(Z)=Z^{-1}\cdot E(Z)+(1-Z^{-1})Q^Z.$$

On abstracting $Z^{-1}\times E(Z)$ corresponding to a simple delay, in this relation, we obtain an equation of form $H(Z)=1+B(Z)\cdot C(Z)$, as referred to hereinbefore.

The use of delta-sigma coders as the sampler in an analog-PCM converter has already been proposed in the article "A single channel PCM coder" by J. D. EVERARD, IEEE, ICC 1978, Toronto, June 1978.

The sampling frequency is 2.048 MHz for the coder described in that article. Such a frequency does not make it possible to obtain the signal-to-noise ratio imposed by the standards, particularly at low levels. It has already been proposed (cf. "Improvements to delta-sigma modulators when used for PCM encoding" by J. D. EVERARD in Electronics Letters, July 22, 1976, Vol.12, No.15, p.379) to increase the signal-to-noise ratio at low levels by injecting a spurious signal at a frequency such that it is filtered by the digital undersampling filter. Such a process increases the signal-to-noise ratio at low levels, but decreases it at high levels.

The construction of second-order (or double integration) delta-sigma coder has already been proposed in the aforementioned U.S. Pat. No. 4,301,466 in which the coder is applied to a transmission channel by modulations of coded pulses and the feedback and negative feedbacks used by it are essentially based on digital technology. The realization of this coder has taken place following a comparative study of various first-order delta-sigma coders using digital technology. These coders are more particularly described in the article "A single PCM Codec" by EVERARD, IEEE Journal of Solid State Circuits, Vol. SC-14, Feb. 1, 1979, as well as in the article "Single-Chip per channel Codec with filters utilizing delta-sigma modulations", by MISAWA, INERSEN, LOPORCADRO and RUCH, IEEE Journal of Solid State Circuits, Vol. SC-16, Aug. 4, 1981.

The investigation of these various constructions shows that the performances reached are inadequate to enable the transmission systems using such coders to correctly conform to the standards laid down by CCITT and in particular notice G712 thereof.

Figure 3:
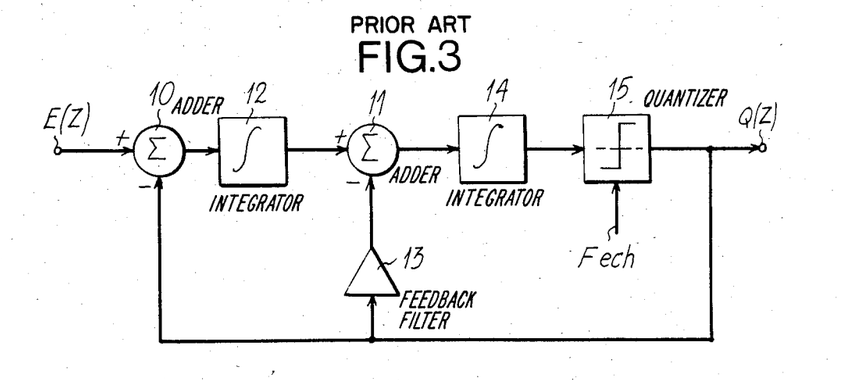
FIG. 3, already described, shows diagrammatically a known second-order delta-sigma coder.

FIG. 3 is a circuit diagram of a known double integration delta-sigma coder, such as described in U.S. Pat. No. 4,301,446. The delta-sigma coder shown comprises a first adder 10 and a second adder 11. Adder 10 firstly receives input signal E(Z) and secondly receives output signal Q(Z) from the coder. The output of this first adder is connected to the input of a first integrator 12, whose output is connected to an input of the second adder 11, which receives the output signal Q(Z) from the coder across a second-order (multiplier by 2) recursive negative feedback filter 13. The output of the second adder 11 is connected to one input of a second integrator 14. Finally, the output of the second integrator is connected to an input of a quantization circuit 15, controlled by a sampling signal having a sampling frequency $F_{ech}$. The output of this sampling circuit constitutes the output of the double integration delta-sigma coder. This transfer function is of form $$F(p) = \frac{p + 2/\tau}{2a \cdot p^2},$$

as indicated in the aforementioned patent. In this relation, $\epsilon = 1/F_{ech}$ designates the sampling cycle or period.

Figure 4:
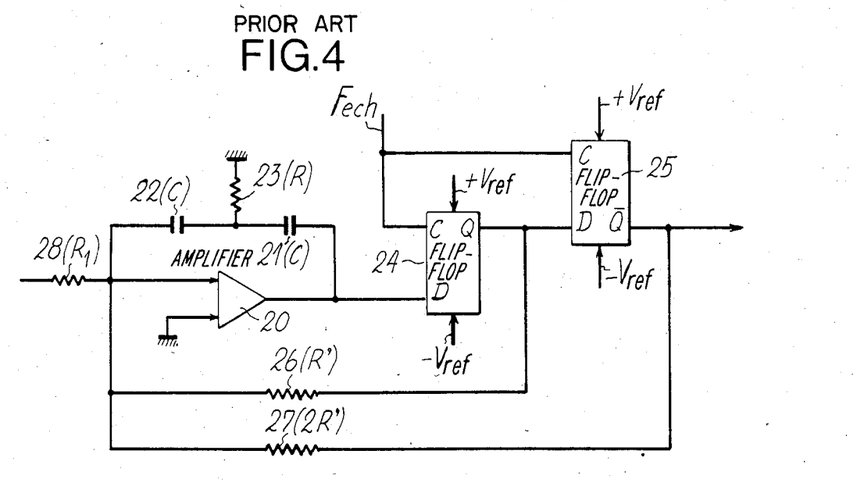
FIG. 4, already described, shows a known practical embodiment of the coder of FIG. 3.

A construction of a second-order delta-sigma coder only using a single operational amplifier is described in U.S. Pat. No. 4,301,446. This coder is diagramamtically shown in FIG. 4 and its transfer function is as follows:

$$F(p) \simeq \frac{-2RC\left(p + \frac{1}{2RC}\right)}{R_1 R C^2 p^2}$$

$$F(p) \simeq -(16R/R_1)\frac{p + \frac{1}{2RC}}{8RC p^2} = GF(p)$$

which becomes $F(p) = \frac{p + 2/\tau}{2\tau_{pe}}$ by setting $G = -16(R/R_1)\tau = 1/f_{ech} = 4RC$.

The double integration delta-sigma coder shown in FIG. 4 comprises an operational amplifier 20 with, in its negative feedback channel, a cell formed by two series-connected capacitors 21, 22 of capacitance C and a parallel resistor 23 of value R. The output of the operational amplifier is connected to two flip-flops 24, 25 in cascade and the outputs thereof are connected to the input of the operational amplifier 20 by resistors 26, 27 of respective resistance R' and 2R'. The resistance of resistor 27 is double that of resistor 26 in order to obtain a binomial coder. The two flip-flops 24, 25 associated with the resistors 26, 27 realize the transfer function $$C(z) = 2 - z^{-1}$$

The output of the second flip-flop is on $\overline{Q}$.

Experience has shown that on choosing $R' = R_1$ ($R_1$ being the resistance of input resistor 28), the voltage of the second-order filter reaches excessively high values, which can cause blocks. To obviate this disadvantage, $$C(z) = 2 - z^{-1},$$

is replaced by $$C(z) = 2(2 - z^{-1}).$$

In FIG. 4, $F_{ech}$ represents the sampling frequency of the sampling signals applied to the input C of the type D flip-flops 24, 25, while $+V_{ref}$ and $-V_{ref}$ represent the reference voltages applied to these flip-flops. This arrangement is very sensitive to noise and the value of the components used therein makes it difficult to integrate.

SUMMARY OF THE INVENTION

The object of the present invention is to obviate these disadvantages and more particularly to provide a double integration, delta-sigma coder, which is relatively insensitive to noise and has easily integratable components. These objects are achieved by means of adders, integrators and filters (multiplier circuit) using switched capacitance arrangements, particularly in the double integration delta-sigma coder, as described in FIG. 3.

The present invention specifically relates to a double integration, delta-sigma coder, incorporating a first adder receiving on a first input a signal to be encoded and receiving the coded signal on a second input, a first integrator receiving on one input an output signal from the first adder, a second adder receiving on a first input the signal from one output of the first integrator, a second input of the second adder receiving a signal having a mean amplitude proportional to the amplitude of the coded signal, a second integrator receiving on an input the output signal of the second adder, a quantizer circuit, one input of which is connected to an output of the second integrator and a control input of which receives a sampling signal of the signal to be coded, an output of the quantizer circuit supplying the coded signal, wherein the first adder and the first integrator comprise a first operational amplifier, an output of which is connected to a negative input of the first operational amplifier by an integration capacitor, a positive input of the first amplifier being connected to a reference earth, and a first pair of inverting circuits with switched capacitors connected in parallel on the inputs of the first operational amplifier and respectively receiving on their inputs the signal to be encoded and the coded signal, the second adder and the second integrator comprising a second operational amplifier, an output of which is connected, on the one hand, to a negative input of the amplifier by an integration capacitor and, on the other hand, to the input of the quantizer circuit, a positive input of the second amplifier being connected to reference earth and a second pair of inverting circuits with switched capcitors connected in parallel on the inputs of the second operational amplifier and respectively receiving on their inputs the output signal of the first amplifier and a signal with a mean amplitude proportional to the amplitude of the coded signal.

According to another feature of the invention, each of the first pair of inverting circuits comprises a first set of two switches connected in series between the reference earth and the negative input of the first amplifier and a second set of two switches connected in series between the reference earth and respectively, for the first pair of inverting circuits a line supplying the signal to be encoded and the output of the quantizer circuit, a switching capacitor connecting in each of the first pair of inverting circuits a point common to the switches of the first set to a point common to the switches of the second set, each of the second pair of inverting circuits comprising a first set of two switches connected in series between the reference earth and the negative input of the second amplifier and a second set of two switches connected in series between the reference earth and respectively, for the second pair of inverting circuits, the output of the first amplifier and the output of the quantizer circuit, a switching capacitor connecting a point common to the switches of the first set to a point common to the switches of the second set.

According to another feature, the coder also comprises a timing circuit supplying two pulse trains controlling the opening and closing of the switches of the inverting circuits, these pulses having a frequency equal to the sampling frequency of the signal to be encoded, one of the switches of each set being open when the other is closed and vice versa.

According to another feature, the quantizer circuit is a type D flip-flop, whereof one input of which is connected to the output of the second amplifier and another control input of this flip-flop receives the pulses of one of the trains, an output of the flip-flop supplying the coded signal.

Finally, according to other features, the coder according to the invention is applicable to an encoding-decoding chain of a PCM transmission channel, as well as to the measurement of d.c. voltages.

BRIEF DESCRIPTION OF THE DRAWINGS

The invention is described in greater detail hereinafter relative to non-limitative embodiments and the attached drawings, wherein FIG. 1, already described, shows diagrammatically a known noise spectrum shaping coder.

DETAILED DESCRIPTION OF THE INVENTION

FIGS. 1, 2, 3 and 4 have already been described to explain the operating principle of delta-sigma coders and noise spectrum coders and will not be described further.

As mentioned hereinbefore, the double integration delta-sigma coder according to the invention uses integrators and adders with operational amplifiers and switched capacitors.

Figure 5:
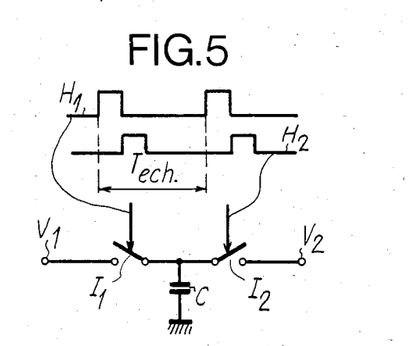
FIG. 5 is a diagram of a switched capacitor circuit, equivalent to a resistor.

FIG. 5 diagrammatically shows a circuit making it possible to simulate a resistor by switching a capacitor C between two voltage sources $V_1$ and $V_2$, by means of two series-connected switches $I_1$, $I_2$ and respectively receiving the voltages $V_1$, $V_2$. The common point of these switches is connected to one of the terminals of capacitor C, whereas the other terminal of the capacitor is connected to a reference earth M. This resistance simulation method by using switched capacitors is known, particularly in connection with MOS integrated circuits. It is more particularly described in the article "MOS sampled data recursive filters using switched capacitor integrators" by HOSTICKA, BRODERSEN and GRAY, IEEE Journal of Solid State Circuits, Vol. SC-12, Dec. 6, 1977.

The represented circuit functions in the following way. When switch $I_1$ is closed (switch $I_2$ being open), the charge of capacitor C is $Q_1 = C.V_1$. Switch $I_2$ is then closed and switch $I_1$ open, so that the charge of capacitor C is then $Q_2 = C.V_2$. The opening and closing of switches $I_1$ and $I_2$ can e.g. be controlled by clock pulses $H_1$, $H_2$ of cycle $F_{ech}$. These opening and closing operations are repeated at a frequency $F_{ech}$. During a clock cycle $F_{ech}$, a charge quantity $Q = CV_1 - CV_2$ passes from voltage supply $V_1$ to voltage supply $V_2$ and corresponds to a mean current:

$$\bar{I} = C(V_1 - V_2) \cdot F.$$

Thus, the capacitor is equivalent to a resistor connected between the two voltage supplies $V_1$ and $V_2$ and having the following resistance:

$$R_{eq} = \frac{1}{C.\,F_{ech}}.$$

Figure 6:
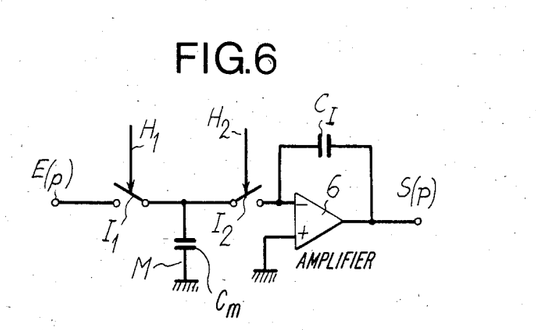
FIG. 6 is a diagram of an integrator-inverter with switched capacitors.

The process of resistance simulation by switched capacitors can be used for realizing an integrating-inverting circuit, like that shown in FIG. 6. In per se known manner, this integrator comprises an operational amplifier 6, whose positive terminal is connected to reference earth M. The output S(P) of this amplifier, which also constitutes the output of the integrator-inverter, is connected to the negative input of the operational amplifier by means of an integration capacitor $C_I$. The integration resistor which is normally connected to the negative input of the operational amplifier is in this case simulated by a switched capacitor circuit (described in FIG. 4), which receives the signal E(P) to be integrated. This circuit comprises a capacitor $C_m$ between the reference earth M and the point common to two switches $I_1$, $I_2$, controlled by the timing signals $H_1$, $H_2$. If it is assumed that the maximum frequency of the useful signal S(P) is well below the sampling frequency $F_{ech}$, it is possible to in the transfer function of the integrator to directly replace the resistor R, which is normally connected to the negative input of the operational amplifier 6, by its equivalent expression $R_{eq}=1/C_m \cdot F_{ech}$, obtained by means of capacitor $C_m$ and switches $I_1$ and $I_2$. If $F_{ech}$ is used to designate the cycle of the sampling signal, the transfer function of the integrator-inverter can be written:

$$H(P) = \frac{C_m}{C_I \cdot F_{ech}} \cdot \frac{1}{P}$$

provided that the frequency F of the input signal E(P) is well below the sampling frequency $F_{ech}=1/F_{ech}$.

The essential advantage of this circuit is that it becomes possible to replace the integration product $R.C_1$, whose elements, although of small size, are difficult to accurately integrate, by a ratio of capacitors $C_m$ and $C_I$, which can be very precisely controlled during the production of integrated circuits.

Figure 7:
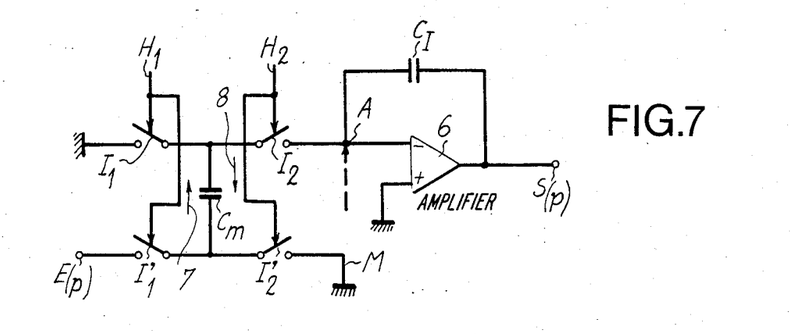
FIG. 7 is a diagram of a non-inverting integrator with switched capacitors used in the coder according to the invention.

FIG. 7 diagrammatically shows a switched capacitor, non-inverting integrating circuit which, in the manner described hereinafter, is to be used in the delta-sigma coder according to the invention. This circuit is a variant of that of FIG. 5, in which the charge is inverted before sending it to the negative input of the operational amplifier, which is itself connected as an inverter. As hereinbefore, the circuit comprises an operational amplifier 6, whose positive terminal is connected to a reference earth M. The output S(P) of this amplifier, which also forms the output of the integrating circuit, is connected to the negative input of the amplifier by an integration capacitor $C_I$.

In this arrangement, capacitor $C_m$ is associated with two sets of switches ($I_1$, $I_2$ and $I_1'$, $I_2'$), whose opening and closing operations are controlled by timing signals $H_1$, $H_2$, at the sampling frequency $F_{ech}$. Switches $I_1$, $I_2$ are connected in series between the reference earth M and the negative input of operational amplifier 6, their common point being connected to one of the terminals of capacitor $C_m$. Switches $I_1'$, $I_2'$ are also connected in series. One of the terminals of switch $I_1'$ receives the input signal E(P) and one of the terminals of switch $I_2'$ is connected to the reference earth M. The common point of the two switches $I_1$ and $I_2'$ is connected to another terminal of capacitor $C_m$. This arrangement makes it possible to invert the charge of capacitor $C_m$ before sending it to the input of amplifier 6. Thus, when switches $I_1$, $I_1'$ are closed, capacitor $C_m$ is charged in the direction indicated by arrow 7, whereas when switches $I_2$, $I_2'$ are closed, the capacitor is charged in the direction of arrow 8 and consequently the charge is reversed at the negative input of the operational amplifier connected as an inverter. Thus, this switched capacitor circuit arrangement is non-inverting and makes it possible to simulate an integration resistor at the input of the operational amplifier 6 and has the main advantage of being insensitive to the parasitic capacitors due to the switches, specifically because it makes it possible to reverse the charge of capacitor $C_m$. These advantages are also described in the article "Improved circuits for the realisation of switched capacitor filters" by MARTIN, IEEE Transactions on Circuit and Systems, Vol CAS-27 of Apr. 4, 1980.

It is also possible to connect several switched capacitors to input A of operational amplifier 6, so that e.g. the addition and then integration operations can be performed. In this case, the equation of the transfer function of the integrator-adder with M inputs is of form:

$$H(Z) = \sum_{i=1}^{i=m} \frac{C_{mi}}{C_I} \cdot \frac{Z^{-i}}{(1-1/Z)}$$

The transfer function H(P) of this integrator-inverter is the same as that of the integrator-inverter of FIG. 6.

Figure 8:
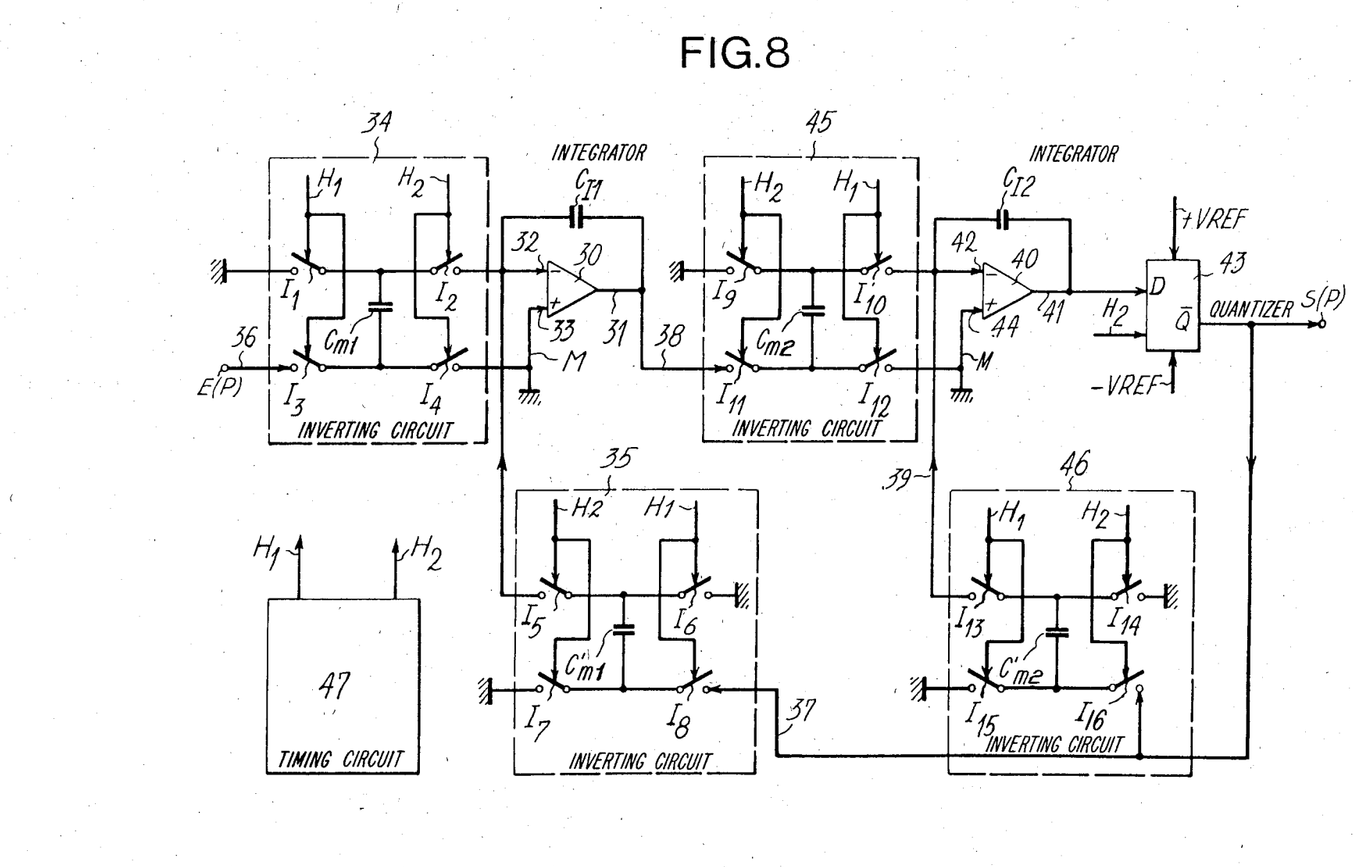
FIG. 8 is a diagram of a double integration delta-sigma coder according to the invention, in which the integrators, adders and filters (multipliers) use operational amplifiers and switched capacitors.

FIG. 8 diagrammatically shows a double integration, delta-sigma coder according to the invention. This coder comprises a first adder-integrator receiving on a first input 36 a signal E(P) to be encoded and on a second input 37 the coded signal of output S(P). According to the invention, the first adder and the first integrator comprise a first operational amplifier 30, an output 31 of which is connected to a negative input 32 of said amplifier by an integration capacitor $C_{I1}$. A positive input 33 of the first amplifier is connected to a reference earth M. This first integrator and this first adder also have two inverting circuits 34, 35 with switched capacitors $C_{m1}$, $C_{m1}'$. This first pair of inverting circuits are connected in parallel on inputs 32, 33 of the first operational amplifier and respectively receive on inputs 36, 37, the signal E(P) to be encoded and the output coded signal S(P) of the coder.

This coder also comprises a second adder-integrator receiving on a first input 38, the output signal of the first integrator-adder and on a second input 39, a signal whose mean amplitude is proportional to the amplitude of the coded output signal S(P). The second adder and the second integrator comprise a second operational amplifier 40, one output 41 of which is connected, on the one hand, to a negative input 42 of amplifier 40 by an integration capacitor $C_{I2}$ and, on the other hand, to an input D of a quantizer circuit 43. The latter is constituted by a type D flip-flop. A positive input 44 of the second amplifier 40 is connected to reference earth M. The second adder and the second integrator also comprise a second pair of inverting circuits 45, 46 with switched capacitors $C_{m2}$, $C_{m2}'$. These two inverting circuits are connected in parallel on inputs 42, 44 of the second amplifier 40. These circuits respectively receive on inputs 38, 39, the output signal of the first amplifier 30 and a signal whose mean amplitude is proportional to the amplitude of the coded signal. The coded signal S(P) is obtained on the complementary output $\bar{Q}$ of flip-flop 43. This flip-flop also has a control input, to which are applied signals $H_2$ from a timing circuit, which will be described in greater detail hereinafter. Reference voltages $+V_{ref}$ and $-V_{ref}$ are applied to two other inputs of the flip-flop.

Each of the first inverting circuits 34, 35 comprises a first set of two switches connected in series between the reference earth M and the negative input 32 of the first amplifier 30. The first set of two switches is represented at $I_1$, $I_2$ for inverting circuit 34, whereas it is represented by $I_5$, $I_6$ for the inverting circuit 35.

Each of the inverting circuits 34, 35 also comprises a second set of switches connected in series between reference earth M and, respectively, the input or line 36 supplying signal E(P) to be encoded and the output $\overline{Q}$ of quantizer circuit 43. The second sets of switches are respectively represented at $I_3$, $I_4$ and $I_7$, $I_8$. The second set of switches $I_3$, $I_4$ is connected in series between the reference earth M and the input or line 36 supplying the signal E(P) to be encoded. The second set of switches $I_7$, $I_8$ is connected in series between the reference earth M and the output $\overline{Q}$ of the quantizer circuit 43. In each of the inverting circuits 34, 35, a switching capacitor connects the point common to the switches of the first set to a point common to the switches of the second set. Thus, capacitor $C_{m1}$ connects the common point of switches $I_1$, $I_2$ to a common point of switches $I_3$, $I_4$ and capacitor $C_{m1}'$ connects a common point of switches $I_5$, $I_6$ to a common point of switches $I_7$, $I_8$.

Each of the inverting circuits 45, 46 comprises a first set of two switches connected in series between reference earth M and the negative input 42 of second amplifier 40. Each of these circuits also comprises a second set of two switches, connected in series between reference earth M and, respectively, output 31 of first amplifier 30 and output $\overline{Q}$ of quantizer circuit 43.

In the drawing, the first sets of two switches are respectively represented as $I_9$, $I_{10}$ and $I_{13}$, $I_{14}$ for the inverting circuits 45, 46. The second sets of two switches are respectively represented as $I_{11}$, $I_{12}$ and $I_{15}$, $I_{16}$ for the inverting circuits 45, 46. In each of these circuits, a switching capacitor connects a point common to the switches of the first set to a point common to the switches of the second set. Thus, capacitor $C_{m2}$ connects a common point of switches $I_9$, $I_{10}$ to a common point of switches $I_{11}$, $I_{12}$ and capacitor $C_{m2}'$ connects a common point of switches $I_{13}$, $I_{14}$ to a common point of switches $I_{15}$, $I_{16}$.

The coder also comprises a timing circuit 47 supplying two pulse trains $H_1$, $H_2$ controlling the opening and closing of the switches of each of the inverting circuits 35, 36, 45, 46. These pulses have been described hereinbefore with reference to FIGS. 5-7. The pulses $H_2$ of one of these pulse trains are also applied to a control input of flip-flop 43. Thus, these pulses have a frequency equal to the sampling frequency of the signal to be encoded and they act in such a way that one of the switches of each set is open when the other is closed and vice versa.

The operation of these first two pairs of adding-integrating circuits respectively constituted by operational amplifier 30, integration capacitor $C_{I1}$, the first pair of inverting circuits 34, 35 and operational amplifier 40, integration capacitor $C_{I2}$, the second pair of inverting circuits 45, 46 will not be described in detail here and can easily be deduced from the explanations given relative to FIG. 7 in the case where a second inverting circuit is connected to the point A shown therein. The mean amplitude of the signal applied to the negative input 42 of the second operational amplifier 40 is proportional to the mean amplitude of the output coded signal S(P) of the coder. This proportionality is obtained by a predetermined choice of the values of capacitors $C_{m2}$, $C_{m2}'$.

The different elements of the coder described hereinbefore can easily be integrated onto the substrate. This coder encounters no problem in ensuring its stability or control. It is, in particular, very easily integratable by a production process using MOS technology.

The transfer function of this codeer can easily be obtained from the following equation in Z of the transfer function of a switched capacitor integrator:

$$Q(Z) = \frac{\gamma_1 \cdot \gamma_2 \cdot E(Z) \cdot Z^{-1} + (1 - Z^{-1})^2 \cdot N(Z)}{Z^{-2}(1 + \gamma'_1 \cdot \gamma_2 - \gamma'_2) + Z^{-1}(\gamma'_2 - 2) + 1}$$

with
$\gamma_1 = C_{m1}/C_{I1}$
$\gamma_2 = C_{m2}/C_{I2}$
$\gamma'_1 = C_{m1}/C_{I1}$
$\gamma'_2 = C_{m2'}/C_{I2}$
The transfer function is then:
$H(Z) = (1 - Z^{-1})^2$.

On taking $\gamma_1 = \gamma'_1 = 0.5$ and $\gamma_2 = \gamma'_2$, we find:

$$Q(Z) = Z^{-1} \cdot E(Z) + (1 - Z^{-1})^2 N(Z),$$

which is the equation of a noise shaping coder.

A complete simulation of this structure on a computer, as well as measurements on a mockup, have revealed that in this case the voltage gain was too high, which led to saturation problems at the output of the operational amplifier.

Tests then showed that a solution of type: $\gamma_1 = 0.25$; $\gamma'_1 = \gamma_2 = 0.5$ and $\gamma'_2 = 1$ represents a good compromise between the theoretical performances of the coder and the overvoltages observed at the output of the operational amplifiers.

The transfer function becomes:

$$Q(Z) = \frac{\tfrac{1}{4}E(Z) Z^{-1} + N(Z)(1 - Z^{-1})^2}{\tfrac{1}{4}Z^{-2} - Z^{-1} + 1} =$$

$$H_p(Z)[\tfrac{1}{4}E(Z)Z^{-1} + N(Z)(1 - Z^{-1})^2.$$

$H_p(Z)$ does not modify the signal-to-noise ratio of the coder in a signal band B, but leads to a slight modification of the spectrum of the input signal. However, account must be taken of the fact that the sampling frequency is very high compared with the maximum of the signal to be coded. In the case of the application of the coder to a PCM channel, the signal limited to a band of 300 to 3400 Hz is sampled at a frequency of 2048 kHz and the attenuation variation provided by $H_p(Z)$ is below 0.02 decibel.

The quantization operation is carried out by a single type D flip-flop. This type of circuit is completely insensitive to the offset of the operational amplifier. Thus, this offset voltage can be considered as forming part of the noise resulting from the quantization operation and therefore is affected by the filtering function H(Z), which has an infinite theoretical attenuation at frequency 0.

Figure 9:
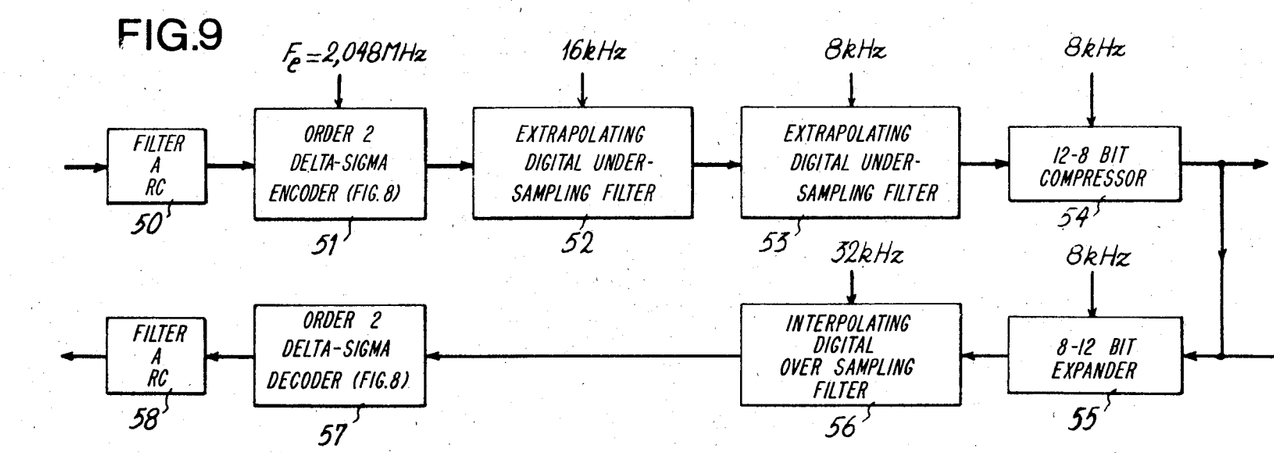
FIG. 9 shows an encoding-decoding chain of a PCM transmission channel to which the coder is applied.

As stated hereinbefore, the coder according to the invention can be used in an encoding-decoding chain of a PCM transmission channel, which is shown in FIG. 9 and is described in U.S. Pat. No. 4,301,446. The second-order delta-sigma coder shown in this chain is in fact the coder according to the invention, described relative to FIG. 8. The chain comprises an analog PCM coder and an analog PCM decoder connected by a single transmission channel.

The analog PCM coder comprises a resistor-capacitor filter 50, a double integration, second-order, delta-sigma coder 51 according to the invention and which operates at 2.048 MHz, a first undersampling digital filter 52 operating at 16 kHz, a second undersampling digital filter 53 operating at 8 kHz and a 12-8 bit compressor 54. The PCM decoder comprises an 8-12 bit expander 55 operating at 8 kHz, an oversampling, interpolator digital filter 56 operating at 32 kHz, a digital double integration, second-order, delta-sigma decoder 57 according to the invention operating at 2.048 MHz and a resistor-capacitor filter 58.

The coder according to the invention is also applicable to the measurement of d.c. voltages. In a second-order, delta-sigma coder, the noise N(Z) resulting from the quantization operation is filtered by the function $H(Z) = (1 - Z^{-1})^2$, whose modulus is proportional to $(\sin 2\pi f \cdot T)^2$, T being the cycle of the sampling signal and f the frequency at which the measurement is performed.

The coder leads to an infinite attenuation on the quantization noise at frequency 0. It is therefore possible to carry out measurements of very fine continuous components with inexpensive equipment.

Figure 10:
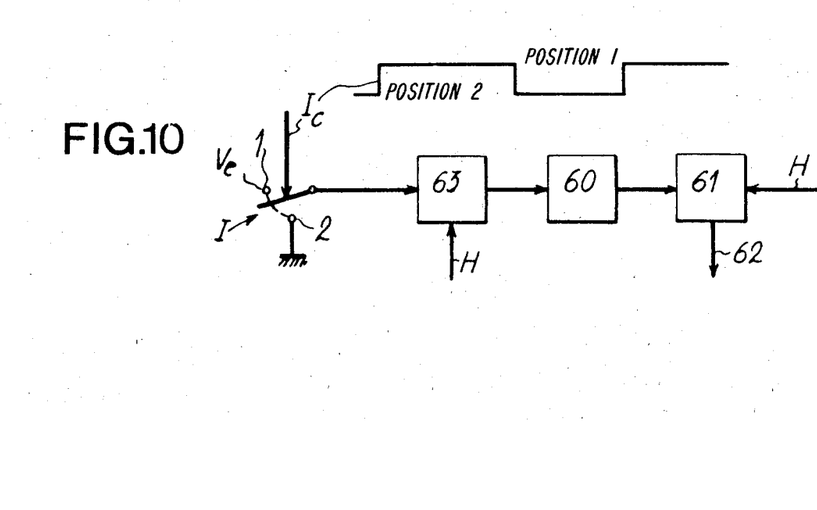
FIG. 10 shows a circuit arrangement by which the coder according to the invention makes it possible to measure d.c. voltages.

FIG. 10 shows an embodiment of a continuous analog-digital converter using a coder 63 according to the invention. Digital filtering is reduced to its simplest form, i.e. a simple accumulation of data in an accumulator 60.

It is known that the transfer function supplied by the accumulation (addition of n successive data as they arrive, followed by the resetting of the accumulator and further accumulation without information loss) is of form:

$$H(Z) = 1 - 1/z^{-(n+1)}$$

In this case, the output signal of coder 63 is sampled at frequency F/n, F being the frequency with which the samples reach the accumulator 60.

In the case of an application to the measurement of absolute voltages, it is firstly necessary to overcome the imperfections of the coder and particularly the offset supplied by it and which could not be differentiated from the measurement of the input signal $V_e$. Under these conditions, the measurements must take place in two parts. These involve the measurement of the offset of coder 61 by closing the input on earth M. Switch I is in position 2 and the result obtained is stored by the arithmetic and logic unit 61 at the end of this first accumulation. The signal is then measured by connecting the input of the coder to the source $V_e$ to be measured (position 1 of switch I) and by initializing accumulator 60 with the result of the first accumulation after inversion, or by subtracting the result of the first accumulation from that of the accumulation obtained with $V_e$ (operations performed by unit 61).

In this case, $I_c$ is a control signal of switch I and H timing control signals of unit 61 and delta-sigma coder 63. If $T_m$ designates the cycle of signals $I_c$, frequency $F_H$ of signals H must be greater than $1/T_m$.

The results of the measurements are obtained on the output 62 of unit 61.

What is claimed is:

1. A double integration, delta-sigma coder, incorporating a first adder receiving on a first input a signal to be encoded and receiving the coded signal on a second input, a first integrator receiving on one input an output signal from the first adder, a second adder receiving on a first input the signal from one output of the first integrator, a second input of said second adder receiving a signal having a mean amplitude proportional to the amplitude of the coded signal, a second integrator receiving on an input the output signal of the second adder, a quantizer circuit, one input of which is connected to an output of the second integrator and a control input of which receives a sampling signal of the signal to be coded, an output of said quantizer circuit supplying the coded signal, wherein the first adder and the first integrator comprise a first operational amplifier, an output of which is connected to a negative input of said first operational amplifier by a first integration capacitor, a positive input of said first operational amplifier being connected to a reference earth, and a first pair of inverting circuits with switched capacitors connected in parallel on the inputs of said first operational amplifier and respectively receiving on their inputs the signal to be encoded and the coded signal, the second adder and the second integrator comprising a second operational amplifier, an output of which is connected, on the one hand, to a negative input of said second operational amplifier by a second integration capacitor and, on the other hand, to the input of the quantizer circuit, a positive input of said second operational amplifier being connected to reference earth and a second pair of inverting circuits with switched capacitors connected in parallel on the inputs of said second operational amplifier and respectively receiving on their inputs the output signal of said first operational amplifier and the coded signal.

2. A coder according to claim 1, wherein each of the first pair of inverting circuits comprises a first set of two switches connected in series between the reference earth and the negative input of the first operational amplifier and a second set of two switches connected in series between the reference earth and respectively, for the first pair of inverting circuits, a line supplying the signal to be encoded and the output of the quantizer circuit, a switching capacitor connecting in each of the first pair of inverting circuits a point common to the switches of the first set to a point common to the switches of the second set, each of the second pair of inverting circuits comprising a first set of two switches connected in series between the reference earth and the negative input of the second operational amplifier and a second set of two switches connected in series between the reference earth and respectively, for the second pair of inverting circuits, the output of the first operational amplifier and the output of the quantizer circuit, a switching capacitor connecting a point common to the switches of the first set to a point common to the switches of the second set.

3. A coder according to claim 2, further comprising a timing circuit supplying two pulse trains controlling the opening and closing of the switches of the inverting circuits, said pulses having a frequency equal to the sampling frequency of the signal to be encoded, one of the switches of each set being open when the other is closed and vice versa.

4. A coder according to claim 3, wherein the quantizer circuit is a type D flip-flop, one input of which is connected to the output of the second operational amplifier and a control input of which receives the pulses of one of the trains, an output of the flip-flop supplying the coded signal.

5. A double integration delta sigma coder circuit comprising first, second, third and fourth single capacitor switching circuit elements each comprising in combination a first circuit path extending from a first external terminal serially through a first switch element, a common point conductive element and a second switch to a second external terminal, a second circuit path extending from a third external terminal serially through a third switch, a second common point conductive element and a fourth switch to a fourth external terminal, a capacitive reactance member having one terminal connected to said first common point conductive element and having the remaining terminal connected to said second common point conductive element, and switch actuation means operable in response to a signal applied at a first input to close said first and said third switches together while said second and said fourth switches are open together and in response to a signal applied at a second input to close said second and said fourth switches together while said first and third switches are open together, said single capacitor switching circuit elements being interconnected with first and second integrator circuit elements each having a negative input, an output and a positive control terminal and each having a capacitor connected between said input and said output terminals thereof, a type D flip flop quantizer element connected between positive and negative reference potentials having a first input connected to the output terminal of said second operational amplifier and having one output serving as the coded signal output, a timing signal source element capable of delivering first and second pulse trains on respectively first and second terminals thereof at the sampling frequency of the signal to be encoded, means impressing the signal to be encoded on said third external terminal of said first single capacitor switching element, means connecting to earth reference the following terminals, said first and fourth external terminals of said first and second single capacitor switching elements, said control terminal of each said integrator circuit element and said second and third external terminals of said third and fourth single capacitor switching elements, means connecting to said input terminal of said first integrator element said second and said first external terminals respectively of said first and said fourth single capacitor switching elements, means connecting to said input terminal of said second integrator element said second and said first external terminals respectively of said second and said third single capacitor switching elements, means connecting the coded signal output to the fourth external terminal of each said third and said fourth single capacitor switching elements and means connecting said first terminal of said timing signal source element to said first switch actuation input of said first and third single capacitor switching elements and to said second switch actuation input of said second and said fourth single capacitor switching elements and means connecting said second terminal of said timing signal source element to said second switch actuation terminal of said first and third single capacitor switching elements, to said first switch actuation terminal of said second and fourth single capacitor switching element and to the second input of said quantizer.

6. A PCM channel comprising in series on an encoding path the following components: an RC filter, an encoder according to claim 5, a digital filter responsive to a first frequency, a digital filter responsive to a second frequency equal to half said first frequency, and a compressor responsive to said second frequency, and in series on a decoding path an RC filter, a decoder according to claim 5, a digital filter responsive to a third frequency equal to twice said first frequency, an expander responsive to said second frequency and means connecting said compressor output and said expander input.

* * * * *